United States Patent
Chatterjee et al.

(10) Patent No.: US 11,697,879 B2
(45) Date of Patent: Jul. 11, 2023

(54) METHODS FOR DEPOSITING SACRIFICIAL COATINGS ON AEROSPACE COMPONENTS

(71) Applicant: Applied Materials, Inc., Santa Clara, CA (US)

(72) Inventors: Sukti Chatterjee, San Jose, CA (US); Kenichi Ohno, Sunnyvale, CA (US); Lance A. Scudder, Sunnyvale, CA (US); Yuriy Melnik, San Jose, CA (US); David A. Britz, San Jose, CA (US); Pravin K. Narwankar, Sunnyvale, CA (US); Thomas Knisley, Livonia, MI (US); Mark Saly, Santa Clara, CA (US); Jeffrey Anthis, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 780 days.

(21) Appl. No.: 16/560,838

(22) Filed: Sep. 4, 2019

(65) Prior Publication Data

US 2020/0392626 A1    Dec. 17, 2020

Related U.S. Application Data

(60) Provisional application No. 62/861,925, filed on Jun. 14, 2019.

(51) Int. Cl.
  *C23C 16/56*    (2006.01)
  *C22C 16/40*    (2006.01)
  *C22C 19/03*    (2006.01)

(52) U.S. Cl.
  CPC ............... *C23C 16/56* (2013.01); *C22C 19/03* (2013.01); *C23C 16/405* (2013.01)

(58) Field of Classification Search
  None
  See application file for complete search history.

(56) References Cited

U.S. PATENT DOCUMENTS

| | | |
|---|---|---|
| 4,698,130 A | 10/1987 | Restall et al. |
| 5,217,757 A | 6/1993 | Olson et al. |
| 5,362,228 A | 11/1994 | Vaudel |
| 5,503,874 A | 4/1996 | Ackerman et al. |
| 5,950,925 A | 9/1999 | Fukunaga et al. |
| 6,042,898 A | 3/2000 | Burns et al. |
| 6,082,444 A | 7/2000 | Harada et al. |
| 6,132,890 A | 10/2000 | Harada et al. |
| 6,156,382 A | 12/2000 | Rajagopalan et al. |
| 6,162,715 A | 12/2000 | Mak et al. |
| 6,207,295 B1 | 3/2001 | Stowell et al. |
| 6,245,192 B1 | 6/2001 | Dhindsa et al. |
| 6,309,713 B1 | 10/2001 | Mak et al. |
| 6,332,926 B1 | 12/2001 | Pfaendtner et al. |
| 6,359,089 B2 | 3/2002 | Hung et al. |
| 6,379,466 B1 | 4/2002 | Sahin et al. |
| 6,387,526 B1 | 5/2002 | Beele |
| 6,402,898 B1 | 6/2002 | Brumer et al. |
| 6,437,066 B1 | 8/2002 | Hung et al. |
| 6,465,040 B2 | 10/2002 | Gupta et al. |
| 6,495,271 B1 | 12/2002 | Vakil |
| 6,544,665 B2 | 4/2003 | Rigney et al. |
| 6,551,929 B1 | 4/2003 | Kori et al. |
| 6,582,772 B2 | 6/2003 | Rigney et al. |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,244 B1 | 10/2003 | Mao et al. |
| 6,677,247 B2 | 1/2004 | Yuan et al. |
| 6,740,585 B2 | 5/2004 | Yoon et al. |
| 6,784,096 B2 | 8/2004 | Chen et al. |

(Continued)

FOREIGN PATENT DOCUMENTS

| | | |
|---|---|---|
| CN | 101302610 A | 11/2008 |
| CN | 104647828 A | 5/2015 |

(Continued)

OTHER PUBLICATIONS

Jacobson et al. Interactions of water vapor with oxides at elevated temperatures. Journal of Physics and Chemistry of Solids (2005). vol. 66, pp. 471-478 (Year: 2005).*

He et al. "Role of annealing temperatures on the evolution of microstructure and properties of Cr2O3 films," Applied Surface Science, vol. 357, Part B, Dec. 1, 2015, pp. 1472-1480, <https://doi.org/10.1016/j.apsusc.2015.10.023>.

Hirata et al. "Corrosion Resistance of Alumina-Chromia Ceramic Materials against Molten Slag," Materials Transactions, vol. 43, No. 10, 2002, pp. 2561-2567, <https://www.jim.or.jp/journal/e/pdf3/43/10/2561.pdf>.

Bensch et al. "Modeling of the Influence of Oxidation of Thin-Walled Specimens of Single Crystal Superalloys," Superalloys 2012: 12th International Symposium on Superalloys, The Minerals, Metals & Materials Society, pp. 331-340, <https://www.tms.org/superalloys/10.7449/2012/Superalloys_2012_331_340.pdf>.

(Continued)

*Primary Examiner* — Jose I Hernandez-Kenney
(74) *Attorney, Agent, or Firm* — Patterson + Sheridan, LLP (57) ABSTRACT

Embodiments of the present disclosure generally relate to protective coatings on aerospace components and methods for depositing the protective coatings. In one or more embodiments, a method for producing a protective coating on an aerospace component includes depositing a metal oxide template layer on the aerospace component containing nickel and aluminum (e.g., nickel-aluminum superalloy) and heating the aerospace component containing the metal oxide template layer during a thermal process and/or an oxidation process. The thermal process and/or oxidation process includes diffusing aluminum contained within the aerospace component towards a surface of the aerospace component containing the metal oxide template layer, oxidizing the diffused aluminum to produce an aluminum oxide layer disposed between the aerospace component and the metal oxide template layer, and removing at least a portion of the metal oxide template layer while leaving the aluminum oxide layer.

20 Claims, 1 Drawing Sheet

(56) References Cited

U.S. PATENT DOCUMENTS

| | | |
|---|---|---|
| 6,797,340 B2 | 9/2004 | Fang et al. |
| 6,800,376 B1 | 10/2004 | Gupta et al. |
| 6,805,750 B1 | 10/2004 | Ristau et al. |
| 6,809,026 B2 | 10/2004 | Yoon et al. |
| 6,811,814 B2 | 11/2004 | Chen et al. |
| 6,821,891 B2 | 11/2004 | Chen et al. |
| 6,825,134 B2 | 11/2004 | Law et al. |
| 6,827,978 B2 | 12/2004 | Yoon et al. |
| 6,831,021 B2 | 12/2004 | Chua et al. |
| 6,833,161 B2 | 12/2004 | Wang et al. |
| 6,838,125 B2 | 1/2005 | Chung et al. |
| 6,846,516 B2 | 1/2005 | Yang et al. |
| 6,869,838 B2 | 3/2005 | Law et al. |
| 6,872,429 B1 | 3/2005 | Chen et al. |
| 6,887,589 B2 | 5/2005 | Darolia et al. |
| 6,905,939 B2 | 6/2005 | Yuan et al. |
| 6,911,391 B2 | 6/2005 | Yang et al. |
| 6,924,191 B2 | 8/2005 | Liu et al. |
| 6,936,538 B2 | 8/2005 | Byun |
| 6,939,801 B2 | 9/2005 | Chung et al. |
| 6,939,804 B2 | 9/2005 | Lai et al. |
| 6,949,342 B2 | 9/2005 | Golub et al. |
| 6,951,804 B2 | 10/2005 | Seutter et al. |
| 6,972,267 B2 | 12/2005 | Cao et al. |
| 6,979,498 B2 | 12/2005 | Darolia et al. |
| 7,011,947 B2 | 3/2006 | Golub et al. |
| 7,026,238 B2 | 4/2006 | Xi et al. |
| 7,041,335 B2 | 5/2006 | Chung |
| 7,049,226 B2 | 5/2006 | Chung et al. |
| 7,081,271 B2 | 7/2006 | Chung et al. |
| 7,101,795 B1 | 9/2006 | Xi et al. |
| 7,172,820 B2 | 2/2007 | Darolia et al. |
| 7,211,144 B2 | 5/2007 | Lu et al. |
| 7,211,508 B2 | 5/2007 | Chung et al. |
| 7,241,686 B2 | 7/2007 | Marcadal et al. |
| 7,244,683 B2 | 7/2007 | Chung et al. |
| 7,262,133 B2 | 8/2007 | Chen et al. |
| 7,264,846 B2 | 9/2007 | Chang et al. |
| 7,265,048 B2 | 9/2007 | Chung et al. |
| 7,279,432 B2 | 10/2007 | Xi et al. |
| 7,285,312 B2 | 10/2007 | Li |
| 7,317,229 B2 | 1/2008 | Hung et al. |
| 7,371,467 B2 | 5/2008 | Han et al. |
| 7,374,825 B2 | 5/2008 | Hazel et al. |
| 7,396,565 B2 | 7/2008 | Yang et al. |
| 7,404,985 B2 | 7/2008 | Chang et al. |
| 7,405,158 B2 | 7/2008 | Lai et al. |
| 7,416,979 B2 | 8/2008 | Yoon et al. |
| 7,429,402 B2 | 9/2008 | Gandikota et al. |
| 7,429,540 B2 | 9/2008 | Olsen |
| 7,439,191 B2 | 10/2008 | Law et al. |
| 7,445,434 B2 | 11/2008 | Harada et al. |
| 7,473,655 B2 | 1/2009 | Wang et al. |
| 7,501,248 B2 | 3/2009 | Golub et al. |
| 7,507,660 B2 | 3/2009 | Chen et al. |
| 7,531,468 B2 | 5/2009 | Metzner et al. |
| 7,547,952 B2 | 6/2009 | Metzner et al. |
| 7,569,501 B2 | 8/2009 | Metzner et al. |
| 7,573,586 B1 | 8/2009 | Boyer et al. |
| 7,585,762 B2 | 9/2009 | Shah et al. |
| 7,595,263 B2 | 9/2009 | Chung et al. |
| 7,601,652 B2 | 10/2009 | Singh et al. |
| 7,651,955 B2 | 1/2010 | Ranish et al. |
| 7,732,327 B2 | 6/2010 | Lee et al. |
| 7,737,028 B2 | 6/2010 | Wang et al. |
| 7,740,960 B1 | 6/2010 | Zhu et al. |
| 7,776,395 B2 | 8/2010 | Mahajani |
| 7,816,200 B2 | 10/2010 | Kher |
| 7,824,743 B2 | 11/2010 | Lee et al. |
| 7,833,358 B2 | 11/2010 | Chu et al. |
| 7,846,840 B2 | 12/2010 | Kori et al. |
| 7,850,791 B2 * | 12/2010 | Quadakkers ............ C23C 8/02 |
| | | 148/287 |
| 7,867,900 B2 | 1/2011 | Lee et al. |
| 7,875,119 B2 | 1/2011 | Gartland et al. |
| 7,910,165 B2 | 3/2011 | Ganguli et al. |
| 7,910,231 B2 | 3/2011 | Schuh et al. |
| 7,910,446 B2 | 3/2011 | Ma et al. |
| 7,964,505 B2 | 6/2011 | Khandelwal et al. |
| 7,972,978 B2 | 7/2011 | Mahajani |
| 8,043,907 B2 | 10/2011 | Ma et al. |
| 8,056,652 B2 | 11/2011 | Lockwood et al. |
| 8,114,852 B2 | 2/2012 | Borca et al. |
| 8,192,941 B2 | 6/2012 | Kuersten |
| 8,227,078 B2 | 7/2012 | Morra et al. |
| 8,277,670 B2 | 10/2012 | Heo et al. |
| 8,426,575 B2 | 4/2013 | Borca et al. |
| 8,470,460 B2 | 6/2013 | Lee |
| 8,721,812 B2 | 5/2014 | Furrer et al. |
| 8,741,420 B2 | 6/2014 | Bunker et al. |
| 8,871,297 B2 | 10/2014 | Barnett et al. |
| 8,932,816 B2 | 1/2015 | Kuersten |
| 9,255,327 B2 | 2/2016 | Winter et al. |
| 9,347,145 B2 | 5/2016 | Bessho |
| 9,416,406 B2 | 8/2016 | Kuersten |
| 9,624,534 B2 | 4/2017 | Kuersten |
| 9,683,281 B2 | 6/2017 | Meehan et al. |
| 9,777,583 B2 | 10/2017 | Leggett |
| 9,873,940 B2 | 1/2018 | Xu et al. |
| 10,072,335 B2 | 9/2018 | Marquardt et al. |
| 10,233,760 B2 | 3/2019 | Lee |
| 10,287,899 B2 | 5/2019 | Dierberger |
| 10,369,593 B2 | 8/2019 | Barnett et al. |
| 10,443,142 B2 | 10/2019 | Miettinen et al. |
| 10,488,332 B2 | 11/2019 | Kessler et al. |
| 10,633,740 B2 | 4/2020 | Melnik et al. |
| 11,028,480 B2 | 6/2021 | Knisley et al. |
| 2002/0002258 A1 | 1/2002 | Hung et al. |
| 2002/0045782 A1 | 4/2002 | Hung et al. |
| 2002/0117399 A1 | 8/2002 | Chen et al. |
| 2002/0127336 A1 | 9/2002 | Chen et al. |
| 2002/0136824 A1 | 9/2002 | Gupta et al. |
| 2003/0010451 A1 | 1/2003 | Tzu et al. |
| 2003/0057526 A1 | 3/2003 | Chung et al. |
| 2003/0059535 A1 | 3/2003 | Luo et al. |
| 2003/0059538 A1 | 3/2003 | Chung et al. |
| 2003/0072884 A1 | 4/2003 | Zhang et al. |
| 2003/0082301 A1 | 5/2003 | Chen et al. |
| 2003/0123216 A1 | 7/2003 | Yoon et al. |
| 2003/0124262 A1 | 7/2003 | Chen et al. |
| 2003/0132319 A1 | 7/2003 | Hytros et al. |
| 2003/0134300 A1 | 7/2003 | Golub et al. |
| 2003/0136520 A1 | 7/2003 | Yudovsky et al. |
| 2003/0139005 A1 | 7/2003 | Song et al. |
| 2003/0145875 A1 | 8/2003 | Han et al. |
| 2003/0152980 A1 | 8/2003 | Golub et al. |
| 2003/0157760 A1 | 8/2003 | Xi et al. |
| 2003/0172872 A1 | 9/2003 | Thakur et al. |
| 2003/0198754 A1 | 10/2003 | Xi et al. |
| 2003/0203616 A1 | 10/2003 | Chung et al. |
| 2003/0215570 A1 | 11/2003 | Seutter et al. |
| 2003/0235961 A1 | 12/2003 | Metzner et al. |
| 2004/0009665 A1 | 1/2004 | Chen et al. |
| 2004/0013803 A1 | 1/2004 | Chung et al. |
| 2004/0018738 A1 | 1/2004 | Liu |
| 2004/0057832 A1 | 3/2004 | Fleck et al. |
| 2004/0079648 A1 | 4/2004 | Khan et al. |
| 2004/0161628 A1 | 8/2004 | Gupta et al. |
| 2004/0171280 A1 | 9/2004 | Conley et al. |
| 2005/0003310 A1 | 1/2005 | Bai et al. |
| 2005/0008780 A1 | 1/2005 | Ackerman et al. |
| 2005/0019593 A1 | 1/2005 | Mancini et al. |
| 2005/0053467 A1 | 3/2005 | Ackerman et al. |
| 2005/0085031 A1 | 4/2005 | Lopatin et al. |
| 2005/0126593 A1 | 6/2005 | Budinger et al. |
| 2005/0158590 A1 * | 7/2005 | Li ..................... C23C 28/325 |
| | | 427/255.19 |
| 2005/0255329 A1 | 11/2005 | Hazel |
| 2005/0260347 A1 | 11/2005 | Narwankar et al. |
| 2005/0260357 A1 | 11/2005 | Olsen et al. |
| 2005/0271813 A1 | 12/2005 | Kher et al. |
| 2006/0008838 A1 | 1/2006 | Golub et al. |
| 2006/0019032 A1 | 1/2006 | Wang et al. |
| 2006/0019033 A1 | 1/2006 | Muthukrishnan et al. |

(56) References Cited

U.S. PATENT DOCUMENTS

| | | |
|---|---|---|
| 2006/0021633 A1 | 2/2006 | Harvey |
| 2006/0024734 A1 | 2/2006 | Golub et al. |
| 2006/0029971 A1 | 2/2006 | Golub et al. |
| 2006/0040052 A1 | 2/2006 | Fang et al. |
| 2006/0057630 A1 | 3/2006 | Golub et al. |
| 2006/0062917 A1 | 3/2006 | Muthukrishnan et al. |
| 2006/0084283 A1 | 4/2006 | Paranjpe et al. |
| 2006/0115659 A1 | 6/2006 | Hazel et al. |
| 2006/0148180 A1 | 7/2006 | Ahn et al. |
| 2006/0153995 A1 | 7/2006 | Narwankar et al. |
| 2006/0228895 A1 | 10/2006 | Chae et al. |
| 2006/0246213 A1 | 11/2006 | Moreau et al. |
| 2006/0286819 A1 | 12/2006 | Seutter et al. |
| 2007/0009658 A1 | 1/2007 | Yoo et al. |
| 2007/0009660 A1 | 1/2007 | Sasaki et al. |
| 2007/0023142 A1 | 2/2007 | LaGraff et al. |
| 2007/0049043 A1 | 3/2007 | Muthukrishnan et al. |
| 2007/0054487 A1 | 3/2007 | Ma et al. |
| 2007/0065578 A1 | 3/2007 | McDougall |
| 2007/0099415 A1 | 5/2007 | Chen et al. |
| 2007/0134518 A1 | 6/2007 | Feist et al. |
| 2007/0160859 A1 | 7/2007 | Darolia et al. |
| 2007/0202254 A1 | 8/2007 | Ganguli et al. |
| 2007/0224411 A1 | 9/2007 | Hazel et al. |
| 2007/0259111 A1 | 11/2007 | Singh et al. |
| 2007/0274837 A1 | 11/2007 | Taylor et al. |
| 2008/0032510 A1 | 2/2008 | Olsen |
| 2008/0038578 A1 | 2/2008 | Li |
| 2008/0056905 A1 | 3/2008 | Golecki |
| 2008/0090425 A9 | 4/2008 | Olsen |
| 2008/0113095 A1 | 5/2008 | Gorman et al. |
| 2008/0135914 A1 | 6/2008 | Krishna et al. |
| 2008/0166548 A1* | 7/2008 | Harada .............. C23C 28/3215 427/454 |
| 2008/0268154 A1 | 10/2008 | Kher et al. |
| 2008/0268635 A1 | 10/2008 | Yu et al. |
| 2009/0004386 A1 | 1/2009 | Makela et al. |
| 2009/0004850 A1 | 1/2009 | Ganguli et al. |
| 2009/0053426 A1 | 2/2009 | Lu et al. |
| 2009/0061613 A1 | 3/2009 | Choi et al. |
| 2009/0098289 A1 | 4/2009 | Deininger et al. |
| 2009/0098346 A1 | 4/2009 | Li |
| 2009/0155976 A1 | 6/2009 | Ahn et al. |
| 2009/0181051 A1 | 7/2009 | Borca et al. |
| 2009/0186237 A1 | 7/2009 | Lee |
| 2009/0239061 A1 | 9/2009 | Hazel et al. |
| 2009/0269507 A1 | 10/2009 | Yu et al. |
| 2009/0286400 A1 | 11/2009 | Heo et al. |
| 2010/0062149 A1 | 3/2010 | Ma et al. |
| 2010/0062614 A1 | 3/2010 | Ma et al. |
| 2010/0075499 A1 | 3/2010 | Olsen |
| 2010/0110451 A1 | 5/2010 | Biswas et al. |
| 2010/0120245 A1 | 5/2010 | Tjandra et al. |
| 2010/0159150 A1 | 6/2010 | Kirby et al. |
| 2010/0167527 A1 | 7/2010 | Wu et al. |
| 2010/0239758 A1 | 9/2010 | Kher et al. |
| 2010/0252151 A1 | 10/2010 | Furrer et al. |
| 2010/0270609 A1 | 10/2010 | Olsen et al. |
| 2010/0279018 A1 | 11/2010 | Hazel et al. |
| 2010/0279305 A1 | 11/2010 | Kuersten |
| 2011/0175038 A1 | 7/2011 | Hou et al. |
| 2011/0293825 A1 | 12/2011 | Atwal et al. |
| 2012/0014992 A1 | 1/2012 | Borca et al. |
| 2012/0024403 A1 | 2/2012 | Gage et al. |
| 2012/0040084 A1 | 2/2012 | Fairbourn |
| 2012/0082783 A1 | 4/2012 | Barnett et al. |
| 2012/0148944 A1 | 6/2012 | Oh et al. |
| 2012/0276306 A1 | 11/2012 | Ueda |
| 2012/0295794 A1 | 11/2012 | Kuersten |
| 2012/0318773 A1 | 12/2012 | Wu et al. |
| 2013/0048605 A1 | 2/2013 | Sapre et al. |
| 2013/0164456 A1 | 6/2013 | Winter et al. |
| 2013/0292655 A1 | 11/2013 | Becker et al. |
| 2013/0331275 A1 | 12/2013 | Kuersten |
| 2014/0065438 A1 | 3/2014 | Lee |
| 2014/0103284 A1 | 4/2014 | Hsueh et al. |
| 2014/0264297 A1 | 9/2014 | Kumar et al. |
| 2014/0271220 A1 | 9/2014 | Leggett |
| 2015/0017324 A1 | 1/2015 | Barnett et al. |
| 2015/0099268 A1 | 4/2015 | Kuersten |
| 2015/0184296 A1 | 7/2015 | Xu et al. |
| 2015/0194682 A1* | 7/2015 | Ashary ................ H01M 8/021 429/468 |
| 2015/0221541 A1 | 8/2015 | Nemani et al. |
| 2016/0010472 A1 | 1/2016 | Murphy et al. |
| 2016/0060746 A1 | 3/2016 | Ramm |
| 2016/0060758 A1 | 3/2016 | Marquardt et al. |
| 2016/0181627 A1* | 6/2016 | Roeder ............... H01M 8/021 118/721 |
| 2016/0251972 A1 | 9/2016 | Dierberger |
| 2016/0281230 A1 | 9/2016 | Varadarajan et al. |
| 2016/0298222 A1* | 10/2016 | Meehan .............. B23K 26/122 |
| 2016/0300709 A1 | 10/2016 | Posseme et al. |
| 2016/0312277 A1 | 10/2016 | Kuersten |
| 2016/0328635 A1 | 11/2016 | Dave et al. |
| 2016/0333493 A1 | 11/2016 | Miettinen et al. |
| 2016/0333494 A1 | 11/2016 | Miettinen et al. |
| 2017/0076968 A1 | 3/2017 | Wang et al. |
| 2017/0084425 A1 | 3/2017 | Uziel et al. |
| 2017/0158978 A1 | 6/2017 | Montagne et al. |
| 2017/0159198 A1 | 6/2017 | Miettinen et al. |
| 2017/0213570 A1 | 7/2017 | Cheng et al. |
| 2017/0233930 A1 | 8/2017 | Keuleers et al. |
| 2017/0292445 A1 | 10/2017 | Nelson et al. |
| 2017/0314125 A1 | 11/2017 | Fenwick et al. |
| 2018/0006215 A1 | 1/2018 | Jeong et al. |
| 2018/0105932 A1 | 4/2018 | Fenwick et al. |
| 2018/0127868 A1 | 5/2018 | Xu et al. |
| 2018/0156725 A1 | 6/2018 | Kessler et al. |
| 2018/0261516 A1 | 9/2018 | Lin et al. |
| 2018/0261686 A1 | 9/2018 | Lin et al. |
| 2018/0329189 A1 | 11/2018 | Banna et al. |
| 2018/0339314 A1 | 11/2018 | Bhoyar et al. |
| 2018/0351164 A1 | 12/2018 | Hellmich et al. |
| 2018/0358229 A1 | 12/2018 | Koshizawa et al. |
| 2019/0019690 A1 | 1/2019 | Choi et al. |
| 2019/0032194 A2 | 1/2019 | Dieguez-Campo et al. |
| 2019/0079388 A1 | 3/2019 | Fender et al. |
| 2019/0088543 A1 | 3/2019 | Lin et al. |
| 2019/0130731 A1 | 5/2019 | Hassan et al. |
| 2019/0153880 A1 | 5/2019 | Lee |
| 2019/0271076 A1 | 9/2019 | Fenwick et al. |
| 2019/0274692 A1 | 9/2019 | Lampropoulos et al. |
| 2019/0284686 A1 | 9/2019 | Melnik et al. |
| 2019/0284692 A1 | 9/2019 | Melnik et al. |
| 2019/0284693 A1* | 9/2019 | Task .................... C23C 16/403 |
| 2019/0284694 A1 | 9/2019 | Knisley et al. |
| 2019/0287808 A1 | 9/2019 | Goradia et al. |
| 2019/0311900 A1 | 10/2019 | Pandit et al. |
| 2019/0311909 A1 | 10/2019 | Bajaj et al. |
| 2019/0330746 A1 | 10/2019 | Britz et al. |
| 2019/0382879 A1 | 12/2019 | Jindal et al. |
| 2020/0027767 A1 | 1/2020 | Zang et al. |
| 2020/0043722 A1 | 2/2020 | Cheng et al. |
| 2020/0240018 A1 | 7/2020 | Melnik et al. |
| 2020/0340107 A1 | 10/2020 | Chatterjee et al. |
| 2020/0361124 A1 | 11/2020 | Britz |
| 2020/0392626 A1 | 12/2020 | Chatterjee et al. |
| 2021/0292901 A1 | 9/2021 | Knisley et al. |

FOREIGN PATENT DOCUMENTS

| | | |
|---|---|---|
| CN | 107313027 A | 11/2017 |
| EP | 0209307 A1 | 1/1987 |
| EP | 0387113 B1 | 12/1993 |
| EP | 1361338 A2 | 11/2003 |
| EP | 1431372 A2 | 6/2004 |
| EP | 1236812 B1 | 5/2006 |
| EP | 2022868 A2 | 2/2009 |
| EP | 2103707 A1 | 9/2009 |
| EP | 2194164 A1 | 6/2010 |
| EP | 2392895 A1 | 12/2011 |
| EP | 2161352 B1 | 2/2014 |
| EP | 3540092 A1 | 9/2019 |

(56) References Cited

FOREIGN PATENT DOCUMENTS

| | | |
|---|---|---|
| JP | 2823086 B2 | 11/1998 |
| JP | 2001342556 A | 12/2001 |
| JP | 2003013745 A | 1/2003 |
| JP | 2003164819 A | 6/2003 |
| JP | 2004285423 A | 10/2004 |
| JP | 2006010403 A | 1/2006 |
| JP | 2006199988 A | 8/2006 |
| JP | 2007182631 A | 7/2007 |
| JP | 2007518881 A | 7/2007 |
| KR | 20060106104 A | 10/2006 |
| KR | 20110014989 A | 2/2011 |
| KR | 101192248 B1 | 10/2012 |
| KR | 20170063149 A | 6/2017 |
| KR | 101761736 B1 | 7/2017 |
| KR | 20170140354 A | 12/2017 |
| RU | 2630733 C2 | 9/2017 |
| TW | 201812075 A | 4/2018 |
| WO | WO-8701736 A * 3/1987 ............... C23C 4/11 |
| WO | 9631687 A1 | 10/1996 |
| WO | 00/09778 A1 | 2/2000 |
| WO | 2005059200 A1 | 6/2005 |
| WO | 2014159267 A1 | 10/2014 |
| WO | 2015047783 A1 | 4/2015 |
| WO | 2019182967 A1 | 9/2019 |

OTHER PUBLICATIONS

Fujita et al. "Sintering of Al2O3—Cr2O3 Powder Prepared by Sol-Gel Process," Journal of the Society of Materials Science, Japan, vol. 56, No. 6, Jun. 2007, pp. 526-530, <http://www.ecm.okayama-u.ac.jp/ceramics/Research/Papers/2007/Fujita_JSMS56(2007)526.pdf>.

International Search Report and Written Opinion dated Jul. 6, 2020 for Application No. PCT/US2020/024285.

International Search Report and Written Report dated Jul. 31, 2020 for Application No. PCT/US2020/027247.

W. Auwarter, "Hexagonal boron nitride monolayers on metal supports: Versatile templates for atoms, molecules and nanostructures", Surface Science Reports 74 (2019) 1-95.

Calderon, "Boron Nitride Growth and Electronics", Cornell University, May 2018.

Liu et al., "Ultrathin high-temperature oxidation-resistant coatings of hexagonal boron nitride" Nature Communications; doi: 10.1038/ncomms3541; Pub. Oct. 4, 2013, 8 pages.

International Search Report and Written Opinion dated Jun. 24, 2020 for Application No. PCT/US2020/019151.

PCT International Search Report and the Written Opinion for International Application No. PCT/US2019/041181; dated Oct. 25, 2019; 15 total pages.

PCT Notification of Transmittal of the International Search Report and the Written Opinion of the International Searching Authority for International Application No. PCT/US2019/019113; dated Jun. 10, 2019; 11 total pages.

Taiwan Office Action dated Apr. 22, 2020 for Application No. 108106406.

Taiwan Office Action dated Dec. 21, 2020 for Application No. 109113600.

International Search Report and Written Opinion dated Feb. 2, 2021 for Application No. PCT/US2020/056618.

Growth mechanism of Cr2O3 scales: oxygen diffusion and chromium, oxidation kinetics and effect of yttrium, Materials Science and Engineering A212 (1996) 6-13.

The Role of Active Elements in the Oxidation Behaviour of High Temperature Metals and Alloys, E. Lang, Dec. 6, 2012 (pp. 111-129 and 153).

Volatility and High Thermal Stability in Mid to Late First Row Transition Metal Diazadienyl Complexes; Organometallics 2011, 30, 5010-5017.

A Review on Alumina-Chrome (AL2O3—CR2O3) and Chrome-Silica (CR2O3—SI02) Refractories Along With Their Binary Phase Diagrams; http://www.idc-online.com/technical_references/pdfs/chemical_engineering/A_Review_on_Alumina_Chrome.pdf.

Oxidation and Hot Corrosion of Superalloys; http://www.tms.org/superalloys/10.7449/1984/Superalloys_1984_651_687.pdf.

International Search Report and Written Opinion dated Jun. 28, 2019 for Application No. PCT/US2019/022709.

International Search Report and Writtne Opinion dated Jul. 2, 2019 for Application No. PCT/US2019/022737.

International Search Report and Written Opinion dated Jul. 2, 2019 for Application No. PCT/US2019/022788.

Kaloyeros, Alain E., et al., "Review-Silicon Nitrtide and Silicon Nitride-Rich Thin Film Technologies: Trends in Deposition Technniques and Related Application". ECS Journal of Solid State Science and Technology, 6 (10) p. 691-p. 714 (2017).

Heidary, Damoon, et al., "Study on the behavior of atomic layer deposition coatings on a nickel substrate at high temperature". Nanotechnology, 27, 245701, 2016, pp. 1-32.

Vargas Garcia, J.R., et al., "Thermal barrier coatings produced by chemical vapor deposition". Science and Technology of Advanced Materials 4 (2003) 397-402.

Dyer, P.N., et al., "CVD Tungsten Carbide and Titanium Carbide Coatings for Aerospace Components". SAE Transactions, vol. 98, Section 1: Journal of Aerospace (1989), pp. 64-70. Abstract Only.

International Search Report and Written Opinion dated Oct. 30, 2020 for Application No. PCT/US2020/041382.

Taiwan Office Action dated May 10, 2021 for Application No. 109126499.

European Search Report dated Jul. 26, 2021 for Application No. 19793402.9.

International Search Report and Written Opinion dated Sep. 28, 2021 for Application No. PCT/US2021/035874.

Extended European Search Report dated Oct. 4, 2021 for Application No. 19793402.9.

Taiwan Office Action dated Oct. 7, 2021 for Application No. 109126499.

International Search Report dated Dec. 1, 2021 for Application No. PCT/US2021/046245.

International Search Report and Written Opinion dated Dec. 2, 2021 for Application No. PCT/US2021/045766.

Wang et al., "Hydrogen permeation properties of CrxCy@Cr2O3/Al2O3 composite coating derived from selective oxidation of a Cr—C alloy and atomic layer deposition", International Journal of Hydrogen Energy, 43 (2018) pp. 21133-21141.

Liu et al., "Microstructural evolution of the interface between NiCrAlY coating and superalloy during isothermal oxidation", Materials and Design, 80 (2015) pp. 63-69.

Extended European Search Report dated Feb. 28, 2022 for Application No. 19771810.9.

Partial Supplementary European Search Report dated Feb. 10, 2022 for Application No. 19770951.2.

Chinese Office Action dated Mar. 16, 2022 for Application No. 201980020460.1.

Extended European Search Report dated May 4, 2022 for Application No. 19770951.2.

Chinese Office Action dated Mar. 17, 2022 for Application No. 201980020567.6.

Sammelselg et al., "Structural characterization of TiO2—Cr2O3 nanolaminates grown by atomic layer deposition"; Surface and Coatings Technology 204 (2010) 2015-2018.

Volz et al., "Novel Nanolaminates for Aerospace Applications", Tennessee Valley Corridor Federal Alliance Collaborative Technology Forum: NANO Technology; Jul. 19, 2006, 12 pages.

International Search Report and Written Opinion dated Feb. 18, 2022 for Application No.

Taiwan Office Action dated Feb. 14, 2022 for Application No. 110136873.

Japanese Office Action dated Feb. 28, 2023 for Application No. 2021-572946.

International Search Report and the Written Opinion for International Application No. PCT/US2020/028462 dated Jul. 29, 2020, 11 pages.

(56) References Cited

OTHER PUBLICATIONS

Haukka, Suvi, et al., "Chemisorption of chromium acetylacetonate on porous high surface area silica". Applied Surface Science, vol. 75, Issues 1-4, Jan. 2, 1994, pp. 220-227. Abstract Only.

Leppaniemi, Jarmo, et al., "Corrosion protection of steel with multilayer coatings: Improving the sealing properties of physical vapor deposition CrN coatings with Al2O3/TiO2atomic layer deposition nanolaminates". Thin Solid Films 627 (2017) pp. 59-68.

Ali, Muhammad Rostom, et al., "Electrodeposition of aluminum-chromium alloys from Al&BPC melt and its corrosion and high temperature oxidation behaviors". Electrochimica Acta, vol. 42. No. 15., pp. 2347-2354, 1997.

Wu, Yanlin, et al., "Atomic Layer Deposition from Dissolved Precursors". Nano Letters 2015, 15, 6379-6385.

Johnson, Andrew L., et al., "Recent developments in molecular precursors for atomic layer deposition". Organomet. Chem., 2019, 42, 1-53.

\* cited by examiner

FIG. 1D

METHODS FOR DEPOSITING SACRIFICIAL COATINGS ON AEROSPACE COMPONENTS

CROSS-REFERENCE TO RELATED APPLICATIONS

This application claims benefit to U.S. Appl. No. 62/861,925, filed on Jun. 14, 2019, which is herein incorporated by reference.

BACKGROUND

Field

Embodiments of the present disclosure generally relate to deposition processes, and in particular to vapor deposition processes for depositing films on aerospace components.

Description of the Related Art

Turbine engines typically have components which corrode or degrade over time due to being exposed to hot gases and/or reactive chemicals (e.g., acids, bases, or salts). Such turbine components are often protected by a thermal and/or chemical barrier coating. The current coatings used on airfoils exposed to the hot gases of combustion in gas turbine engines for both environmental protection and as bond coats in thermal barrier coating (TBC) systems include both diffusion aluminides and various metal alloy coatings. These coatings are applied over substrate materials, typically nickel-based superalloys, to provide protection against oxidation and corrosion attack. These coatings are formed on the substrate in a number of different ways. For example, a nickel aluminide layer may be grown as an outer coat on a nickel base superalloy by simply exposing the substrate to an aluminum rich environment at elevated temperatures. The aluminum diffuses into the substrate and combines with the nickel to form an outer surface of the nickel-aluminum alloy.

However, as the increased demands for engine performance elevate the engine operating temperatures and/or the engine life requirements, improvements in the performance of coatings when used as environmental coatings or as bond coatings are needed over and above the capabilities of these existing coatings. Because of these demands, a coating that can be used for environmental protection or as a bond coat capable of withstanding higher operating temperatures or operating for a longer period of time before requiring removal for repair, or both, is desired. These known coating materials and deposition techniques have several shortcomings. Most metal alloy coatings deposited by low pressure plasma spray, plasma vapor deposition (PVD), electron beam PVD (EBPVD), cathodic arc, or similar sputtering techniques are line of sight coatings, meaning that interiors of components are not able to be coated. Platinum electroplating of exteriors typically forms a reasonably uniform coating, however, electroplating the interior of a component has proven to be challenging. The resulting electroplating coatings are often too thin to be protective or too thick that there are other adverse mechanical effects, such as high weight gain or fatigue life debit. Similarly, aluminide coatings suffer from non-uniformity on interior passages of components. Aluminide coatings are brittle, which can lead to reduced life when exposed to fatigue.

In addition, most of these coatings are on the order of greater than 10 micrometers in thickness, which can cause component weight to increase, making design of the disks and other support structures more challenging. Many of these coatings also require high temperature (e.g., greater than 500° C.) steps to deposit or promote enough interdiffusion of the coating into the alloy to achieve adhesion. It is desired by many to have coatings that (1) protect metals from oxidation and corrosion, (2) have high adhesion to the metal, and/or (3) are sufficiently thin to not materially increase weight or reduce fatigue life outside of current design practices for bare metal.

Therefore, improved protective coatings and methods for depositing the protective coatings are needed.

SUMMARY

Embodiments of the present disclosure generally relate to protective coatings on aerospace components and methods for depositing the protective coatings. In one or more embodiments, a method for producing a protective coating on an aerospace component includes depositing a metal oxide template layer on the aerospace component containing nickel and aluminum (e.g., nickel-aluminum superalloy) and heating the aerospace component containing the metal oxide template layer during a thermal process and/or an oxidation process. The thermal process and/or oxidation process includes diffusing aluminum contained within the aerospace component towards a surface of the aerospace component containing the metal oxide template layer, oxidizing the diffused aluminum to produce an aluminum oxide layer disposed between the aerospace component and the metal oxide template layer, and removing all or some of the metal oxide template layer while leaving the aluminum oxide layer. The metal oxide template layer may partially form a solid solution of the templating element with the aluminum oxide layer.

In some embodiments, a method for producing a protective coating on an aerospace component includes depositing a metal oxide template layer on the aerospace component containing nickel and aluminum, where the metal oxide template layer contains chromium oxide, tungsten oxide, molybdenum oxide, vanadium oxide, or any combination thereof. The method also includes heating the aerospace component containing the metal oxide template layer to a temperature of about 900° C. to about 1,200° C. during a thermal process and/or an oxidation process. The thermal process and/or oxidation process includes diffusing aluminum contained within the aerospace component towards a surface of the aerospace component containing the metal oxide template layer, oxidizing the diffused aluminum to produce an aluminum oxide layer disposed between the aerospace component and the metal oxide template layer, and removing all or some of the metal oxide template layer while leaving the aluminum oxide layer. The metal oxide template layer may partially form a solid solution of the templating element with the aluminum oxide layer.

In other embodiments, an aerospace component contains a body containing a nickel superalloy, a metal oxide template layer disposed on the body, and an aluminum oxide layer disposed between the body of the aerospace component and the metal oxide template layer. The superalloy within the body contains nickel, aluminum, and one or more metals selected from chromium, cobalt, titanium, molybdenum, tungsten, or alloys thereof. The metal oxide template layer contains chromium, tungsten, molybdenum, vanadium or any combination thereof. In some examples, the aluminum oxide layer contains $\alpha$-$Al_2O_3$. The metal oxide template layer and the aluminum oxide layer have the same crystal structure, such as a corundum crystal structure. The metal oxide template layer and the aluminum oxide layer can have crystal structures with a lattice mismatch of about 0.1% to about 10%. The metal oxide template layer may partially form a solid solution of the templating element with the aluminum oxide layer. The solid solution zone of mixed metal oxides has a lattice mismatch less than that of the templating oxide and the aluminum oxide.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to protective coatings disposed on an aerospace components and methods for depositing or otherwise forming the protective coatings. Aerospace components as described and discussed herein can be or include one or more turbine blades, turbine vanes, ribs, fins, pin fins, combustor fuel nozzles, combustor shields, or any other aerospace component or part that can benefit from having protective coating deposited thereon. The protective coatings can be deposited or otherwise formed on interior surfaces and/or exterior surfaces of the aerospace components.

In one or more embodiments, a method for producing a protective coating on an aerospace component includes depositing a metal oxide template layer on the aerospace component containing nickel and aluminum (e.g., nickel-aluminum superalloy) and heating the aerospace component containing the metal oxide template layer during a thermal process and/or an oxidation process. The thermal process and/or oxidation process includes diffusing aluminum contained within the aerospace component towards a surface of the aerospace component containing the metal oxide template layer, oxidizing the diffused aluminum to produce an aluminum oxide layer disposed between the aerospace component and the metal oxide template layer, and removing at least a portion of the metal oxide template layer while leaving the aluminum oxide layer.

Figure 1A:
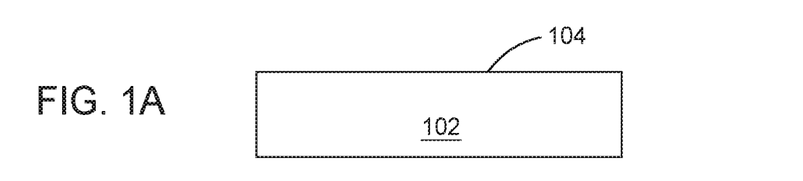
FIGS. 1A-1D are schematic cross-sectional views of protective coatings disposed on an aerospace component at different time intervals, according to one or more embodiments described and discussed herein.

FIGS. 1A-1D are schematic cross-sectional views of protective coatings disposed on an aerospace component 102 at different time intervals, according to one or more embodiments described and discussed herein. FIG. 1A depicts the aerospace component 102 having a surface 104. The surface 104 can be one or more interior surfaces and/or one or more exterior surfaces of the aerospace component 102. The aerospace component 102 can be or include a turbine blade, a turbine vane, a support member, a frame, a rib, a fin, a pin fin, a combustor fuel nozzle, a combustor shield, an internal cooling channel, or any combination thereof. The aerospace component 102 contains one or more nickel superalloys. The nickel superalloy can be or include a nickel-aluminum superalloy and contain nickel, aluminum, and one or more metals selected from chromium, cobalt, titanium, molybdenum, tungsten, other elements, dopants thereof, or alloys thereof.

The nickel superalloy contains about 20 wt %, about 30 wt %, about 40 wt %, about 45 wt %, about 48 wt %, about 50 wt %, about 55 wt %, about 58 wt %, or about 60 wt % to about 62 wt %, about 65 wt %, about 68 wt %, about 70 wt %, about 75 wt %, about 80 wt %, about 85 wt %, or about 90 wt % of nickel. For examples, the nickel superalloy contains about 20 wt % to about 90 wt %, about 30 wt % to about 80 wt %, about 40 wt % to about 90 wt %, about 40 wt % to about 80 wt %, about 40 wt % to about 75 wt %, about 20 wt % to about 70 wt %, about 40 wt % to about 65 wt %, about 40 wt % to about 62 wt %, about 40 wt % to about 60 wt %, about 40 wt % to about 58 wt %, about 40 wt % to about 55 wt %, about 40 wt % to about 50 wt %, about 50 wt % to about 90 wt %, about 50 wt % to about 80 wt %, about 50 wt % to about 75 wt %, about 20 wt % to about 70 wt %, about 50 wt % to about 65 wt %, about 50 wt % to about 62 wt %, about 50 wt % to about 60 wt %, about 50 wt % to about 58 wt %, about 50 wt % to about 55 wt %, about 58 wt % to about 90 wt %, about 58 wt % to about 80 wt %, about 58 wt % to about 75 wt %, about 20 wt % to about 70 wt %, about 58 wt % to about 65 wt %, about 58 wt % to about 62 wt %, or about 58 wt % to about 60 wt % of nickel.

The nickel superalloy contains about 0.2 wt %, about 0.5 wt %, about 0.8 wt %, about 1 wt %, about 1.5 wt %, about 2 wt %, about 2.5 wt %, about 3 wt %, about 3.5 wt %, about 4 wt %, or about 4.5 wt % to about 5 wt %, about 6 wt %, about 7 wt %, about 8 wt %, about 9 wt %, about 10 wt %, about 12 wt %, about 15 wt %, about 18 wt %, or about 20 wt % of aluminum. For example, the nickel superalloy contains about 0.2 wt % to about 20 wt %, about 0.5 wt % to about 20 wt %, about 0.5 wt % to about 18 wt %, about 0.5 wt % to about 15 wt %, about 0.5 wt % to about 12 wt %, about 0.5 wt % to about 10 wt %, about 0.5 wt % to about 8 wt %, about 0.5 wt % to about 6 wt %, about 0.5 wt % to about 5 wt %, about 0.5 wt % to about 4 wt %, about 0.5 wt % to about 3 wt %, about 0.5 wt % to about 2 wt %, about 0.5 wt % to about 1 wt %, about 1 wt % to about 20 wt %, about 1 wt % to about 18 wt %, about 1 wt % to about 15 wt %, about 1 wt % to about 12 wt %, about 1 wt % to about 10 wt %, about 1 wt % to about 8 wt %, about 1 wt % to about 6 wt %, about 1 wt % to about 5 wt %, about 1 wt % to about 4 wt %, about 1 wt % to about 3 wt %, about 1 wt % to about 2 wt %, about 1 wt % to about 1 wt %, about 3 wt % to about 20 wt %, about 3 wt % to about 18 wt %, about 3 wt % to about 15 wt %, about 3 wt % to about 12 wt %, about 3 wt % to about 10 wt %, about 3 wt % to about 8 wt %, about 3 wt % to about 6 wt %, about 3 wt % to about 5 wt %, or about 3 wt % to about 4 wt % of aluminum.

In one or more examples, the nickel superalloy contains about 40 wt % or greater of nickel and about 0.5 wt % to about 15 wt % of aluminum. In some examples, the nickel superalloy contains about 50 wt % or greater of nickel and about 1 wt % to about 10 wt % of aluminum. In other examples, the nickel superalloy contains about 58 wt % or greater of nickel and about 2 wt % to about 8 wt % of aluminum.

In some examples, the nickel superalloy can be or include the CMSX-4 superalloy, the CMSX-4 Plus superalloy, PWA alloys, Rene alloys, one or more Inconel alloys, one or more Haynes alloys, e.g. Haynes 214, Haynes 233, alumina forming austenitic steel alloys, or any combinations thereof. Table 1 provides the elemental compositions of several exemplary superalloys useful in embodiments described and discussed herein. In Table 1, Alloy (1) is the CMSX-4 superalloy, Alloy (2) is the CMSX-4 Plus superalloy, and all weights are in units of weight percent (wt %) unless otherwise noted.

TABLE 1

| Alloy | Ni | Co | Cr | Mo | W | Re | Ru | Ta | Al | Hf |
|---|---|---|---|---|---|---|---|---|---|---|
| (1) | 61.7 | 9 | 6.5 | 0.6 | 6 | 3 | 0 | 6.5 | 5.6 | 0.1 |
| (2) | 60.5 | 10 | 3.5 | 0.6 | 6 | 4.8 | 0 | 8 | 5.7 | 0.1 |

| Alloy | Nb | C | Fe | O | Ti | Zr | B | S (ppmw) | Y (ppmw) |
|---|---|---|---|---|---|---|---|---|---|
| (1) | 0 | 0 | 0 | 0 | 1 | 0 | 0 | 2 | 0 |
| (2) | 0 | 0 | 0 | 0 | 0.85 | 0 | 0 | 0.5-1 | 0 |

Figure 1B:
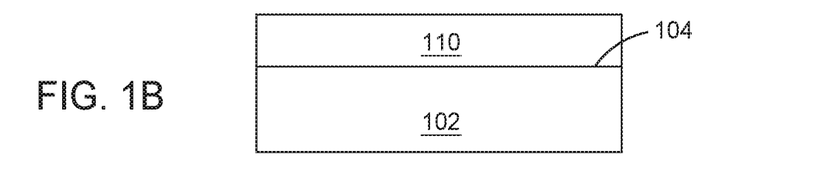

FIG. 1B depicts a metal oxide template layer 110 disposed on the surface 104 of the aerospace component 102, as described and discussed in one or more embodiments herein. The metal oxide template layer 110 contains one or more metal oxides, such as chromium oxide (e.g., CrO, $CrO_2$, or $Cr_2O_3$), tungsten oxide (e.g., $WO_3$), molybdenum oxide (e.g., $MoO_2$ or $MoO_3$), vanadium oxide (e.g., VO, $VO_2$, or $V_2O_5$), dopants thereof, or any combination thereof. In some examples, the metal oxide template layer 110 does not include aluminum oxide as a template layer. The metal oxide contained in the metal oxide template layer 110 has a crystalline lattice that promotes the growth or otherwise formation of aluminum oxide during a thermal process and/or an oxidation process. The metal oxide contained in the metal oxide template layer 110 can be sublimed, evaporated, oxidized, or otherwise removed from the aerospace component 102 at a later time. As such, the metal oxide template layer is removed by sublimation or evaporation or oxidation during the thermal process and/or oxidation process during and/or subsequent to the formation of the aluminum oxide. In one or more examples, the metal oxide template layer 110 contains chromium oxide, and the method further includes converting the chromium oxide to chromium oxide hydroxide ($CrO_2(OH)_2$) during the thermal process and/or oxidation process.

The metal oxide template layer 110 has a thickness of about 10 nm, about 20 nm, about 30 nm, about 50 nm, about 80 nm, about 100 nm, about 150 nm, or about 200 nm to about 250 nm, about 300 nm, about 350 nm, about 400 nm, about 500 nm, about 600 nm, about 700 nm, about 800 nm, about 900 nm, about 1,000 nm, about 1,200 nm, about 1,500 nm, about 1,800 nm, about 2,000 nm, about 3,500 nm, about 5,000 nm, about 7,500 nm, about 10,000 nm, or thicker. For example, the metal oxide template layer 110 has a thickness of about 1,000 nm to about 2,000 nm, about 1,000 nm to about 5,000 nm, about 2,000 nm to about 10,000 nm, about 10 nm to about 10,000 nm, about 10 nm to about 5,000 nm, about 10 nm to about 3,500 nm, about 10 nm to about 2,000 nm, about 10 nm to about 1,500 nm, about 10 nm to about 1,000 nm, about 10 nm to about 800 nm, about 10 nm to about 600 nm, about 10 nm to about 500 nm, about 10 nm to about 400 nm, about 10 nm to about 300 nm, about 10 nm to about 200 nm, about 10 nm to about 100 nm, about 10 nm to about 80 nm, about 10 nm to about 50 nm, about 10 nm to about 30 nm, about 100 nm to about 2,000 nm, about 100 nm to about 1,500 nm, about 100 nm to about 1,000 nm, about 100 nm to about 800 nm, about 100 nm to about 600 nm, about 100 nm to about 500 nm, about 100 nm to about 400 nm, about 100 nm to about 300 nm, or about 100 nm to about 200 nm.

The metal oxide template layer 110 can be deposited on the aerospace component 102 by one or more vapor deposition processes, such an atomic layer deposition (ALD) process, a plasma-enhanced ALD (PE-ALD) process, a thermal chemical vapor deposition (CVD) process, a plasma-enhanced CVD (PE-CVD) process, as well as other deposition processes.

Figure 1C:
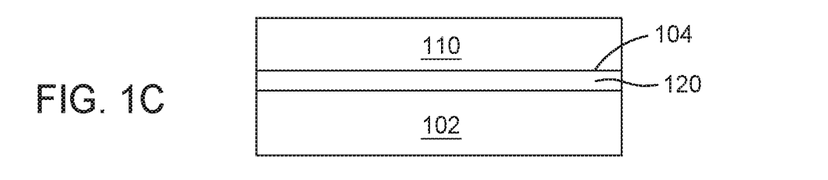
Figure 1D:
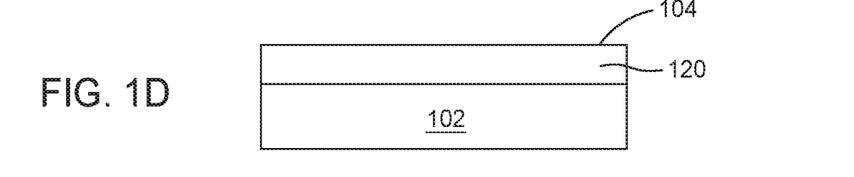

FIG. 10 depicts an aluminum oxide layer 120 disposed between the aerospace component 102 and the metal oxide template layer 110, as described and discussed in one or more embodiments herein. The aerospace component 102 containing the metal oxide template layer 110 is exposed to one or more thermal processes and/or one or more oxidation processes to produce the aluminum oxide layer 120. As the thermal process and/or oxidation process progresses, the aluminum oxide layer 120 continues to form and the metal oxide template layer 110 progressively is removed. Eventually, the metal oxide template layer 110 is completely consumed or otherwise removed and the aluminum oxide layer 120 is the protective coating for the remaining portion of the aerospace component 102, as depicted in FIG. 1D.

In one or more embodiments, the thermal process and/or oxidation process includes diffusing aluminum contained within the aerospace component 102 towards the surface 104 containing the metal oxide template layer 110, oxidizing the diffused aluminum to produce the aluminum oxide layer 120 which is disposed between the aerospace component 102 and the metal oxide template layer 110, and removing at least a portion of the metal oxide template layer 110 while leaving the aluminum oxide layer 120. In some examples, the metal oxide template layer 110 is substantially removed or completely removed during the thermal process and/or oxidation process.

In some embodiments, the metal oxide template layer 110 and the aluminum oxide layer 120 have the same crystalline structure or substantially the same crystalline structure. In one or more examples, the metal oxide template layer 110 and the aluminum oxide layer 120 have a corundum crystal structure. The metal oxide template layer 110 performs as a template and nucleates and helps grow the aluminum oxide layer 120 from the diffused aluminum and therefore they both share the common lattice or crystalline structure. In some examples, the aluminum oxide layer 120 contains α-$Al_2O_3$. The metal oxide template layer 110 and the aluminum oxide layer 120 have crystal structures with a lattice mismatch of about 0.1%, about 0.5%, about 1%, about 2%, about 3%, or about 4% to about 5%, about 6%, about 8%, or about 10%. For example, the metal oxide template layer 110 and the aluminum oxide layer 120 have crystal structures with a lattice mismatch of about 0.1% to about 10%, about 0.5% to about 8%, or about 1% to about 5%.

The aluminum oxide layer 120 has a thickness of about 10 nm, about 20 nm, about 30 nm, about 50 nm, about 80 nm, about 100 nm, about 150 nm, or about 200 nm to about 250 nm, about 300 nm, about 350 nm, about 400 nm, about 500 nm, about 600 nm, about 700 nm, about 800 nm, about 900 nm, about 1,000 nm, about 1,200 nm, about 1,500 nm, about 2,000 nm, about 2,500 nm, about 3,000 nm, about 5,000 nm, about 6,000 nm, about 10,000 nm, or thicker. For example, the aluminum oxide layer 120 has a thickness of about 1,000 nm to about 2,000 nm, about 1,000 nm to about 5,000 nm, or about 2,000 nm to about 10,000 nm, about 10 nm to about 10,000 nm, about 10 nm to about 8,000 nm, about 10 nm to about 5,000 nm, about 10 nm to about 3,500 nm, about 10 nm to about 2,000 nm, about 10 nm to about 1,500 nm, about 10 nm to about 1,200 nm, about 10 nm to about 1,000 nm, about 10 nm to about 800 nm, about 10 nm to about 600 nm, about 10 nm to about 500 nm, about 10 nm to about 400 nm, about 10 nm to about 300 nm, about 10 nm to about 200 nm, about 10 nm to about 100 nm, about 10 nm to about 80 nm, about 10 nm to about 50 nm, about 10 nm to about 30 nm, about 20 nm to about 1,000 nm, about 20 nm to about 800 nm, about 20 nm to about 600 nm, about 20 nm to about 500 nm, about 20 nm to about 400 nm, about 20 nm to about 300 nm, about 20 nm to about 200 nm, about 20 nm to about 100 nm, about 20 nm to about 80 nm, about 20 nm to about 50 nm, about 100 nm to about 1,200 nm, about 100 nm to about 1,000 nm, about 100 nm to about 800 nm, about 100 nm to about 600 nm, about 100 nm to about 500 nm, about 100 nm to about 400 nm, about 100 nm to about 300 nm, or about 100 nm to about 200 nm.

In one or more embodiments, during the thermal process and/or oxidation process, the aerospace component is heated to a temperature of about 800° C., about 850° C., about 900° C., about 950° C., about 980° C., or about 1,000° C. to about 1,050° C., about 1,100° C., about 1,150° C., about 1,200° C., about 1,300° C., about 1,400° C., or about 1,500° C. For example the aerospace component is heated to a temperature of about 800° C. to about 1,500° C., about 800° C. to about 1,300° C., about 800° C. to about 1,150° C., about 800° C. to about 1,100° C., about 800° C. to about 1,050° C., about 800° C. to about 1,000° C., about 800° C. to about 950° C., about 800° C. to about 900° C., about 850° C. to about 1,500° C., about 850° C. to about 1,300° C., about 850° C. to about 1,150° C., about 850° C. to about 1,100° C., about 850° C. to about 1,050° C., about 850° C. to about 1,000° C., about 850° C. to about 950° C., about 850° C. to about 900° C., about 950° C. to about 1,500° C., about 950° C. to about 1,300° C., about 950° C. to about 1,150° C., about 950° C. to about 1,100° C., about 950° C. to about 1,050° C., or about 950° C. to about 1,000° C. during the thermal process and/or oxidation process.

In some embodiments, during the thermal process and/or oxidation process, the aerospace component is heated for about 20 minutes, about 30 minutes, about 40 minutes, about 50 minutes, about 1 hour, about 1.5 hours, or about 2 hours to about 3 hours, about 5 hours, about 8 hours, about 10 hours, about 20 hours, about 24 hours, about 30 hours, about 50 hours, about 80 hours, about 100 hours, about 1,000 hours, about 10,000 hours, about 25,000 hours, about 35,000 hours, about 50,000 hours, about 100,000 hours, about 200,000 hours or longer. For example, the aerospace component is heated for about 20 minutes to about 100 hours, about 20 minutes to about 50 hours, about 20 minutes to about 24 hours, about 20 minutes to about 10 hours, about 20 minutes to about 5 hours, about 20 minutes to about 2 hours, about 20 minutes to about 1 hour, about 20 minutes to about 45 minutes, about 20 minutes to about 40 minutes, or about 20 minutes to about 30 minutes during the thermal process and/or oxidation process.

In some embodiments, the aerospace component is thermally cycled while running or otherwise using the aerospace component in a turbine, an engine, a pump, or other machinery. For example, the aerospace component is heated while running a jet or a pump containing the aerospace component, then cooled when use is stopped. This heating and cooling is a single thermal cycle and can be repeated numerous times as the thermal process and/or oxidation process. As such, during the thermal process and/or oxidation process, the aerospace component can be thermally cycled from an ambient temperature of about −50° C. to about 35° C., then heated to warmer temperature of about 35° C. to about 100° C., then heated to a process temperature of about 100° C. to about 1,200° C. Thereafter, the aerospace component can be cooled to warmer temperature and/or the ambient temperature to complete one thermal cycle. These heating and cooling sub-cycles form a single thermal cycle which can be repeated 2 times, 3 times, about 50 times, about 100 times, about 500 times, or about 1,000 times to about 2,000 times, about 4,000 times, about 10,000 times, about 15,000 times, about 25,000 times, or more.

In one or more examples, the aerospace component is heated to a temperature of about 800° C. to about 1,500° C. for about 20 minutes to about 100 hours during the thermal process. In other examples, the aerospace component is heated to a temperature of about 900° C. to about 1,200° C. during the thermal process. In some examples, the aerospace component is heated to a temperature of about 1,000° C. to about 1,100° C. during the thermal process.

In one or more embodiments, oxygen is diffused through the metal oxide template layer before reacting with the aluminum to produce the aluminum oxide layer during the thermal process and/or oxidation process. The oxygen can come from one or more oxygen sources. Exemplary oxygen sources or oxidizing agents can be or include oxygen gas ($O_2$), ambient air (containing $O_2$), water or vapor, ozone, atomic oxygen, nitrous oxide, hydrogen peroxide, one or more organic peroxides, or any combination thereof. In one or more examples, the aerospace component and the metal oxide template layer are exposed to air containing the oxygen during the thermal process and/or oxidation process. This ambient oxygen ($O_2$) is the oxidizing agent during the thermal process and/or oxidation process.

In one or more embodiments, the method includes powering a jet engine or a turbine containing the aerospace component while performing the thermal process and/or oxidation process. For example, thermal energy derived from combustion of fuel in the jet engine or the turbine is used to heat the aerospace component and the metal oxide template layer during the thermal process and/or oxidation process. In some examples, the jet engine containing the aerospace component is attached to an aircraft which is flown between destinations. In other examples, the turbine is a land-based turbine (e.g., pump) containing the aerospace component which is ran during the thermal process and/or oxidation process.

In other embodiments, the aerospace component and the metal oxide template layer are heated in a processing chamber or furnace containing one or more oxygen sources or oxidizing agents during the thermal process and/or oxidation process. Exemplary oxygen sources or oxidizing agents can be or include oxygen gas ($O_2$), ambient air (containing $O_2$), water or vapor, ozone, atomic oxygen, nitrous oxide, hydrogen peroxide, one or more organic peroxides, or any combination thereof.

In one or more embodiments, the aerospace component and the metal oxide template layer are preheated for a first period, maintained at a predetermined temperature for a second period, and cooled for a third period during one heat cycle of the thermal process. The predetermined temperature is about 900° C. to about 1,200° C., or about 1,000° C. to about 1,100° C. The heat cycle can be repeated from 2, 3, 5, 8, 10, 12, 15, or 20 times to about 30, about 40, about 50, about 80, about 100, about 120, about 150, about 200, about 250, about 300, about 1,000, about 2,000, about 3,500, about 5,000, about 10,000, about 20,000, about 30,000, or more. In some examples, the heat cycle can be repeated from 2 about 300 times, from 10 times to about 150 times, from 20 times to about 100 times, or from 2,000 times to about 10,000 times.

In one or more examples, the first period is about 1 minute to about 30 minutes, the second period is about 15 minutes to about 120 minutes, and the third period is about 0.5 minutes to about 15 minutes. In some examples, the first period is about 5 minutes to about 25 minutes, the second period is about 20 minutes to about 90 minutes, and the third period is about 1 minute to about 10 minutes. In other examples, the first period is about 10 minutes to about 20 minutes, the second period is about 30 minutes to about 60 minutes, and the third period is about 3 minutes to about 8 minutes.

In one or more embodiments, an aerospace component contains a body containing a nickel superalloy, a metal oxide template layer disposed on the body, and an aluminum oxide layer disposed between the body of the aerospace component and the metal oxide template layer. The superalloy within the body contains nickel, aluminum, and one or more metals selected from chromium, cobalt, titanium, molybdenum, tungsten, or alloys thereof. The metal oxide template layer contains chromium, tungsten, molybdenum, vanadium or any combination thereof. In some examples, the aluminum oxide layer contains $\alpha$-$Al_2O_3$. The metal oxide template layer and the aluminum oxide layer have the same crystal structure, such as a corundum crystal structure. The metal oxide template layer and the aluminum oxide layer can have crystal structures with a lattice mismatch of about 0.1%, about 0.5%, about 1%, about 2%, about 3%, or about 4% to about 5%, about 6%, about 7%, about 8%, about 9%, or about 10%. For example, the metal oxide template layer and the aluminum oxide layer can have crystal structures with a lattice mismatch of about 0.1% to about 10%, about 2% to about 6%, about 3% to about 5%, or about 3.5% to about 4.5.

Optional Pre-Clean of Aerospace Component

Prior to depositing or otherwise forming the metal oxide template layer on the aerospace component, the aerospace component may be optionally exposed to one or more pre-clean processes. The surfaces of the aerospace component can contain oxides, organics, oil, soil, particulate, debris, and/or other contaminants are removed prior to producing the metal oxide template layer (e.g., protective coating) on the aerospace component. The pre-clean process can be or include one or more basting or texturing processes, vacuum purges, solvent clean, acid clean, wet clean, plasma clean, sonication, or any combination thereof. Once cleaned and/or textured, the subsequently deposited metal oxide template layer has stronger adhesion to the surfaces of the aerospace component than if otherwise not exposed to the pre-clean process.

In one or more examples, the surfaces of the aerospace component can be blasted with or otherwise exposed to beads, sand, carbonate, or other particulates to remove oxides and other contaminates therefrom and/or to provide texturing to the surfaces of the aerospace component. In some examples, the aerospace component can be placed into a chamber within a pulsed push-pull system and exposed to cycles of purge gas (e.g., $N_2$, Ar, He, or any combination thereof) and vacuum purges to remove debris from small holes on the aerospace component. In other examples, the surfaces of the aerospace component can be exposed to hydrogen plasma, oxygen or ozone plasma, and/or nitrogen plasma, which can be generated in a plasma chamber or by a remote plasma system.

In one or more examples, such as for organic removal or oxide removal, the surfaces of the aerospace component can be exposed to a hydrogen plasma, then degassed, then exposed to ozone treatment. In other examples, such as for organic removal, the surfaces of the aerospace component can be exposed to a wet clean that includes: soaking in an alkaline degreasing solution, rinsing, exposing the surfaces to an acid clean (e.g., sulfuric acid, phosphoric acid, or hydrochloric acid), rinsing, and exposing the surfaces deionized water sonication bath. In some examples, such as for oxide removal, the surfaces of the aerospace component can be exposed to a wet clean that includes: exposing the surfaces to a dilute acid solution (e.g., acetic acid or hydrochloric acid), rinsing, and exposing the surfaces deionized water sonication bath. In one or more examples, such as for particle removal, the surfaces of the aerospace component can be exposed to sonication (e.g., megasonication) and/or a supercritical carbon dioxide wash, followed by exposing to cycles of purge gas (e.g., $N_2$, Ar, He, or any combination thereof) and vacuum purges to remove particles from and dry the surfaces. In some examples, the aerospace component can be exposed to heating or drying processes, such as heating the aerospace component to a temperature of about 50° C., about 65° C., or about 80° C. to about 100° C., about 120° C., or about 150° C. and exposing to surfaces to the purge gas. The aerospace component can be heated in an oven or exposed to lamps for the heating or drying processes.

Vapor Deposition of Metal Oxide Template Layer

The aerospace component can be exposed to a first precursor and a first reactant to form the deposited oxide layer on the aerospace component by a vapor deposition process. The vapor deposition process can be an ALD process, a plasma-enhanced ALD (PE-ALD) process, a thermal chemical vapor deposition (CVD) process, a plasma-enhanced CVD (PE-CVD) process, or any combination thereof.

In one or more embodiments, the vapor deposition process is an ALD process and the method includes sequentially exposing the surface of the aerospace component to the first precursor and the first reactant to form the deposited oxide layer. Each cycle of the ALD process includes exposing the surface of the aerospace component to the first precursor, conducting a pump-purge, exposing the aerospace component to the first reactant, and conducting a pump-purge to form the deposited oxide layer. The order of the first precursor and the first reactant can be reversed, such that the ALD cycle includes exposing the surface of the aerospace component to the first reactant, conducting a pump-purge, exposing the aerospace component to the first precursor, and conducting a pump-purge to form the deposited oxide layer.

In some examples, during each ALD cycle, the aerospace component is exposed to the first precursor for about 0.1 seconds to about 10 seconds, the first reactant for about 0.1 seconds to about 10 seconds, and the pump-purge for about 0.5 seconds to about 30 seconds. In other examples, during each ALD cycle, the aerospace component is exposed to the first precursor for about 0.5 seconds to about 3 seconds, the first reactant for about 0.5 seconds to about 3 seconds, and the pump-purge for about 1 second to about 10 seconds.

Each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, or more times to form the first deposited layer. For example, each ALD cycle is repeated from 2 times to about 1,000 times, 2 times to about 800 times, 2 times to about 500 times, 2 times to about 300 times, 2 times to about 250 times, 2 times to about 200 times, 2 times to about 150 times, 2 times to about 120 times, 2 times to about 100 times, 2 times to about 80 times, 2 times to about 50 times, 2 times to about 30 times, 2 times to about 20 times, 2 times to about 15 times, 2 times to about 10 times, 2 times to 5 times, about 8 times to about 1,000 times, about 8 times to about 800 times, about 8 times to about 500 times, about 8 times to about 300 times, about 8 times to about 250 times, about 8 times to about 200 times, about 8 times to about 150 times, about 8 times to about 120 times, about 8 times to about 100 times, about 8 times to about 80 times, about 8 times to about 50 times, about 8 times to about 30 times, about 8 times to about 20 times, about 8 times to about 15 times, about 8 times to about 10 times, about 20 times to about 1,000 times, about 20 times to about 800 times, about 20 times to about 500 times, about 20 times to about 300 times, about 20 times to about 250 times, about 20 times to about 200 times, about 20 times to about 150 times, about 20 times to about 120 times, about 20 times to about 100 times, about 20 times to about 80 times, about 20 times to about 50 times, about 20 times to about 30 times, about 50 times to about 1,000 times, about 50 times to about 500 times, about 50 times to about 350 times, about 50 times to about 300 times, about 50 times to about 250 times, about 50 times to about 150 times, or about 50 times to about 100 times to form the deposited oxide layer.

In other embodiments, the vapor deposition process is a CVD process and the method includes simultaneously exposing the aerospace component to the first precursor and the first reactant to form the deposited oxide layer. During an ALD process or a CVD process, each of the first precursor and the first reactant can independent include one or more carrier gases. One or more purge gases can be flowed across the aerospace component and/or throughout the processing chamber in between the exposures of the first precursor and the first reactant. In some examples, the same gas may be used as a carrier gas and a purge gas. Exemplary carrier gases and purge gases can independently be or include one or more of nitrogen ($N_2$), argon, helium, neon, hydrogen ($H_2$), or any combination thereof.

The deposited oxide layer can have a thickness of about 0.1 nm, about 0.2 nm, about 0.3 nm, about 0.4 nm, about 0.5 nm, about 0.8 nm, about 1 nm, about 2 nm, about 3 nm, about 5 nm, about 8 nm, about 10 nm, about 12 nm, or about 15 nm to about 18 nm, about 20 nm, about 25 nm, about 30 nm, about 40 nm, about 50 nm, about 60 nm, about 80 nm, about 100 nm, about 120 nm, or about 150 nm. For example, the deposited oxide layer can have a thickness of about 0.1 nm to about 150 nm, about 0.2 nm to about 150 nm, about 0.2 nm to about 120 nm, about 0.2 nm to about 100 nm, about 0.2 nm to about 80 nm, about 0.2 nm to about 50 nm, about 0.2 nm to about 40 nm, about 0.2 nm to about 30 nm, about 0.2 nm to about 20 nm, about 0.2 nm to about 10 nm, about 0.2 nm to about 5 nm, about 0.2 nm to about 1 nm, about 0.2 nm to about 0.5 nm, about 0.5 nm to about 150 nm, about 0.5 nm to about 120 nm, about 0.5 nm to about 100 nm, about 0.5 nm to about 80 nm, about 0.5 nm to about 50 nm, about 0.5 nm to about 40 nm, about 0.5 nm to about 30 nm, about 0.5 nm to about 20 nm, about 0.5 nm to about 10 nm, about 0.5 nm to about 5 nm, about 0.5 nm to about 1 nm, about 2 nm to about 150 nm, about 2 nm to about 120 nm, about 2 nm to about 100 nm, about 2 nm to about 80 nm, about 2 nm to about 50 nm, about 2 nm to about 40 nm, about 2 nm to about 30 nm, about 2 nm to about 20 nm, about 2 nm to about 10 nm, about 2 nm to about 5 nm, about 2 nm to about 3 nm, about 10 nm to about 150 nm, about 10 nm to about 120 nm, about 10 nm to about 100 nm, about 10 nm to about 80 nm, about 10 nm to about 50 nm, about 10 nm to about 40 nm, about 10 nm to about 30 nm, about 10 nm to about 20 nm, or about 10 nm to about 15 nm.

In one or more embodiments, the first precursor contains one or more chromium precursors, one or more tungsten precursors, or one or more molybdenum precursors, one or more vanadium precursors. The first reactant contains one or more oxidizing agents. In some examples, the deposited oxide layer is chromium oxide (e.g., CrO, $CrO_2$, or $Cr_2O_3$), tungsten oxide (e.g., $WO_3$), molybdenum oxide (e.g., $MoO_2$ or $MoO_3$), vanadium oxide (e.g., VO, $VO_2$, or $V_2O_5$), dopants thereof, or any combination thereof.

The chromium precursor can be or include one or more of chromium cyclopentadiene compounds, chromium carbonyl compounds, chromium acetylacetonate compounds, chromium diazadienyl compounds, substitutes thereof, complexes thereof, abducts thereof, salts thereof, or any combination thereof. Exemplary chromium precursor can be or include bis(cyclopentadiene) chromium ($Cp_2Cr$), bis(pentamethylcyclopentadiene) chromium (($Me_5Cp)_2Cr$), bis(isoproplycyclopentadiene) chromium (($iPrCp)_2Cr$), bis(ethylbenzene) chromium (($EtBz)_2Cr$), chromium hexacarbonyl ($Cr(CO)_6$), chromium acetylacetonate ($Cr(acac)_3$, also known as, tris(2,4-pentanediono) chromium), chromium hexafluoroacetylacetonate ($Cr(hfac)_3$), chromium(III) tris(2,2,6,6-tetramethyl-3,5-heptanedionate) $\{Cr(tmhd)_3\}$, chromium(II) bis(1,4-ditertbutyldiazadienyl), isomers thereof, complexes thereof, abducts thereof, salts thereof, or any combination thereof. Exemplary chromium diazadienyl compounds can have a chemical formula of:

where each R and R' is independently selected from H, C1-C6 alkyl, aryl, acyl, alkylamido, hydrazido, silyl, aldehyde, keto, C2-C4 alkenyl, alkynyl, or substitutes thereof. In some examples, each R is independently a C1-C6 alkyl which is selected from methyl, ethyl, propyl, butyl, or isomers thereof, and R' is H. For example, R is metyl and R' is H, R is ethyl and R' is H, R is iso-propyl and R' is H, or R is tert-butyl and R' is H.

Exemplary oxidizing agents can be or include water (e.g., steam), oxygen ($O_2$), atomic oxygen, ozone, nitrous oxide, one or more peroxides, one or more alcohols, plasmas thereof, or any combination thereof.

Embodiments of the present disclosure further relate to any one or more of the following paragraphs 1-35:

1. A method for producing a protective coating on an aerospace component, comprising: depositing a metal oxide template layer on the aerospace component comprising nickel and aluminum; and heating the aerospace component containing the metal oxide template layer during a thermal process comprising: diffusing aluminum contained within the aerospace component towards a surface of the aerospace component containing the metal oxide template layer; oxidizing the diffused aluminum to produce an aluminum oxide layer disposed between the aerospace component and the metal oxide template layer; and removing at least a portion of the metal oxide template layer while leaving the aluminum oxide layer.

2. A method for producing a protective coating on an aerospace component, comprising: depositing a metal oxide template layer on the aerospace component comprising nickel and aluminum, wherein the metal oxide template layer comprises chromium oxide, tungsten oxide, molybdenum oxide, vanadium oxide, or any combination thereof; and heating the aerospace component containing the metal oxide template layer to a temperature of about 900° C. to about 1,200° C. during a thermal process comprising: diffusing aluminum contained within the aerospace component towards a surface of the aerospace component containing the metal oxide template layer; oxidizing the diffused aluminum to produce an aluminum oxide layer disposed between the aerospace component and the metal oxide template layer; and removing at least a portion of the metal oxide template layer while leaving the aluminum oxide layer.

3. An aerospace component, comprising: a body comprising a nickel superalloy, the superalloy comprises nickel, aluminum, and one or more metals selected from chromium, cobalt, titanium, molybdenum, tungsten, or alloys thereof; a metal oxide template layer disposed on the body, wherein the metal oxide template layer comprises chromium, tungsten, molybdenum, vanadium or any combination thereof; and an aluminum oxide layer disposed between the body of the aerospace component and the metal oxide template layer.

4. The method or the aerospace component according to any one of paragraphs 1-3, wherein the metal oxide template layer comprises chromium oxide, tungsten oxide, molybdenum oxide, vanadium oxide, or any combination thereof.

5. The method or the aerospace component according to any one of paragraphs 1-4, wherein the metal oxide template layer comprises chromium oxide, and the method further comprises converting the chromium oxide to chromium oxide hydroxide during the thermal process.

6. The method or the aerospace component according to any one of paragraphs 1-5, wherein the metal oxide template layer has a thickness of about 10 nm to about 2,000 nm.

7. The method or the aerospace component according to any one of paragraphs 1-6, wherein the metal oxide template layer has a thickness of about 100 nm to about 1,000 nm.

8. The method or the aerospace component according to any one of paragraphs 1-7, wherein the aluminum oxide layer has a thickness of about 10 nm to about 1,000 nm.

9. The method or the aerospace component according to any one of paragraphs 1-8, wherein the aluminum oxide layer has a thickness of about 20 nm to about 500 nm.

10. The method or the aerospace component according to any one of paragraphs 1-9, wherein the aluminum oxide layer comprises $\alpha$-$Al_2O_3$.

11. The method or the aerospace component according paragraph 10, wherein the metal oxide template layer and the aluminum oxide layer have a corundum crystal structure.

12. The method or the aerospace component according paragraph 10, wherein the metal oxide template layer and the aluminum oxide layer have crystal structures with a lattice mismatch of about 0.1% to about 10%.

13. The method or the aerospace component according to any one of paragraphs 1-12, wherein the metal oxide template layer is removed by sublimation or evaporation or oxidation during the thermal process.

14. The method or the aerospace component according to any one of paragraphs 1-13, wherein the aerospace component is heated to a temperature of about 800° C. to about 1,500° C. for about 20 minutes to about 100 hours during the thermal process.

15. The method or the aerospace component according paragraph 14, wherein the aerospace component is heated to a temperature of about 900° C. to about 1,200° C. during the thermal process.

16. The method or the aerospace component according paragraph 15, wherein the aerospace component is heated to a temperature of about 1,000° C. to about 1,100° C. during the thermal process.

17. The method or the aerospace component according to any one of paragraphs 1-16, wherein oxygen is diffused through the metal oxide template layer before reacting with the aluminum to produce the aluminum oxide layer.

18. The method or the aerospace component according paragraph 17, wherein the aerospace component and the metal oxide template layer are exposed to air containing the oxygen during the thermal process.

19. The method or the aerospace component according to any one of paragraphs 1-18, further comprising powering a jet engine or a turbine containing the aerospace component while performing the thermal process.

20. The method or the aerospace component according paragraph 19, wherein thermal energy from the jet engine or the turbine is used to heat the aerospace component and the metal oxide template layer during the thermal process.

21. The method or the aerospace component according to any one of paragraphs 1-20, wherein the aerospace component and the metal oxide template layer are heated in a processing chamber or furnace during the thermal process.

22. The method or the aerospace component according paragraph 21, wherein the aerospace component and the metal oxide template layer are preheated for a first period, maintained at a predetermined temperature for a second period, and cooled for a third period during one heat cycle of the thermal process.

23. The method or the aerospace component according paragraph 22, wherein the first period is about 1 minute to about 30 minutes, the second period is about 15 minutes to about 120 minutes, and the third period is about 0.5 minutes to about 15 minutes.

24. The method or the aerospace component according paragraph 22, wherein the first period is about 5 minutes to about 25 minutes, the second period is about 20 minutes to about 90 minutes, and the third period is about 1 minute to about 10 minutes.

25. The method or the aerospace component according paragraph 22, wherein the first period is about 10 minutes to about 20 minutes, the second period is about 30 minutes to about 60 minutes, and the third period is about 3 minutes to about 8 minutes.

26. The method or the aerospace component according paragraph 22, wherein the heat cycle is repeated from 2 times to about 300 times.

27. The method or the aerospace component according paragraph 22, wherein the heat cycle is repeated from 10 times to about 150 times.

28. The method or the aerospace component according paragraph 22, wherein the predetermined temperature is about 900° C. to about 1,200° C.

29. The method or the aerospace component according paragraph 22, wherein the predetermined temperature is about 1,000° C. to about 1,100° C.

30. The method or the aerospace component according to any one of paragraphs 1-29, wherein the metal oxide template layer is deposited on the aerospace component by an ALD process or a CVD process.

31. The method or the aerospace component according to any one of paragraphs 1-30, wherein the aerospace component is a turbine blade, a turbine vane, a support member, a frame, a rib, a fin, a pin fin, a combustor fuel nozzle, a combustor shield, an internal cooling channel, or any combination thereof.

32. The method or the aerospace component according to any one of paragraphs 1-31, wherein the aerospace component comprises a nickel superalloy, and wherein the nickel superalloy comprises nickel, aluminum, and one or more metals selected from chromium, cobalt, titanium, molybdenum, tungsten, or alloys thereof.

33. The method or the aerospace component according paragraph 32, wherein the nickel superalloy comprises about 40 wt % or greater of nickel and about 0.5 wt % to about 15 wt % of aluminum.

34. The method or the aerospace component according paragraph 32, wherein the nickel superalloy comprises about 50 wt % or greater of nickel and about 1 wt % to about 10 wt % of aluminum.

35. The method or the aerospace component according paragraph 32, wherein the nickel superalloy comprises about 58 wt % or greater of nickel and about 2 wt % to about 8 wt % of aluminum.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for producing a protective coating on an aerospace component, comprising:
    depositing a metal oxide template layer comprising chromium oxide on the aerospace component comprising nickel and aluminum by an atomic layer deposition (ALD) process or a chemical vapor deposition (CVD) process, wherein the metal oxide template layer further comprises tungsten oxide, molybdenum oxide, vanadium oxide, or any combination thereof; and
    heating the aerospace component containing the metal oxide template layer during a thermal process comprising:
        diffusing aluminum contained within the aerospace component towards a surface of the aerospace component containing the metal oxide template layer;
        oxidizing the diffused aluminum to produce an aluminum oxide layer disposed between the aerospace component and the metal oxide template layer, wherein the aluminum oxide layer comprises α-Al$_2$O$_3$, wherein the metal oxide template layer and the aluminum oxide layer have a corundum crystal structure, and wherein the metal oxide template layer and the aluminum oxide layer have crystal structures with a lattice mismatch of about 0.1% to about 10%; and
        removing at least a portion of the metal oxide template layer while leaving the aluminum oxide layer by converting the chromium oxide to chromium oxide hydroxide during the thermal process.

2. The method of claim 1, wherein the metal oxide template layer has a thickness of about 10 nm to about 2,000 nm, and wherein the aluminum oxide layer has a thickness of about 10 nm to about 1,000 nm.

3. The method of claim 1, wherein the metal oxide template layer is removed by sublimation or evaporation or oxidation during the thermal process.

4. The method of claim 1, wherein the aerospace component is heated to a temperature of about 800° C. to about 1,500° C. for about 20 minutes to about 100 hours during the thermal process.

5. The method of claim 1, wherein oxygen is diffused through the metal oxide template layer before reacting with the aluminum to produce the aluminum oxide layer, and wherein the aerospace component and the metal oxide template layer are exposed to air containing the oxygen during the thermal process.

6. The method of claim 1, further comprising powering a jet engine or a turbine containing the aerospace component while performing the thermal process, wherein thermal energy from the jet engine or the turbine is used to heat the aerospace component and the metal oxide template layer during the thermal process.

7. The method of claim 1, wherein the aerospace component and the metal oxide template layer are heated in a processing chamber or furnace during the thermal process.

8. The method of claim 7, wherein the aerospace component and the metal oxide template layer are preheated for a first period, maintained at a predetermined temperature for a second period, and cooled for a third period during one heat cycle of the thermal process.

9. The method of claim 8, wherein the first period is about 1 minute to about 30 minutes, the second period is about 15 minutes to about 120 minutes, and the third period is about 0.5 minutes to about 15 minutes.

10. The method of claim 8, wherein the heat cycle is repeated from 2 times to about 300 times, and wherein the predetermined temperature is about 900° C. to about 1,200° C.

11. The method of claim 1, wherein the metal oxide template layer is deposited on the aerospace component by the ALD process.

12. The method of claim 1, wherein the aerospace component is a turbine blade, a turbine vane, a support member, a frame, a rib, a fin, a pin fin, a combustor fuel nozzle, a combustor shield, an internal cooling channel, or any combination thereof.

13. The method of claim 1, wherein the aerospace component comprises a nickel superalloy, and wherein the nickel superalloy comprises nickel, aluminum, and one or more metals selected from chromium, cobalt, titanium, molybdenum, tungsten, or alloys thereof.

14. The method of claim 13, wherein the nickel superalloy comprises about 40 wt % or greater of nickel and about 0.5 wt % to about 15 wt % of aluminum.

15. A method for producing a protective coating on an aerospace component, comprising:
- depositing a metal oxide template layer on the aerospace component comprising nickel and aluminum by an atomic layer deposition (ALD) process or a chemical vapor deposition (CVD) process, wherein the metal oxide template layer comprises chromium oxide and a metal oxide selected from tungsten oxide, molybdenum oxide, vanadium oxide, or any combination thereof; and
- heating the aerospace component containing the metal oxide template layer to a temperature of about 900° C. to about 1,200° C. during a thermal process comprising:
  - diffusing aluminum contained within the aerospace component towards a surface of the aerospace component containing the metal oxide template layer;
  - oxidizing the diffused aluminum to produce an aluminum oxide layer disposed between the aerospace component and the metal oxide template layer, wherein the aluminum oxide layer comprises $\alpha\text{-}Al_2O_3$, wherein the metal oxide template layer and the aluminum oxide layer have a corundum crystal structure, and wherein the metal oxide template layer and the aluminum oxide layer have crystal structures with a lattice mismatch of about 0.1% to about 10%; and
  - removing at least a portion of the metal oxide template layer while leaving the aluminum oxide layer by converting the chromium oxide to chromium oxide hydroxide during the thermal process.

16. The method of claim 15, wherein the aerospace component is a turbine blade, a turbine vane, a support member, a frame, a rib, a fin, a pin fin, a combustor fuel nozzle, a combustor shield, an internal cooling channel, or any combination thereof.

17. A method for producing a protective coating on an aerospace component, comprising:
- depositing a metal oxide template layer on the aerospace component comprising nickel and aluminum by an atomic layer deposition (ALD) process or a chemical vapor deposition (CVD) process, wherein the metal oxide template layer comprises chromium oxide and a metal oxide selected from tungsten oxide, molybdenum oxide, vanadium oxide, or any combination thereof; and
- powering a jet engine or a turbine containing the aerospace component while performing a thermal process, wherein thermal energy from the jet engine or the turbine heats the aerospace component and the metal oxide template layer to a temperature of about 900° C. to about 1,200° C. during the thermal process, where in the thermal process further comprises:
  - diffusing aluminum contained within the aerospace component towards a surface of the aerospace component containing the metal oxide template layer; and
  - oxidizing the diffused aluminum to produce an aluminum oxide layer disposed between the aerospace component and the metal oxide template layer, wherein the metal oxide template layer and the aluminum oxide layer have a corundum crystal structure, and wherein the metal oxide template layer and the aluminum oxide layer have crystal structures with a lattice mismatch of about 0.1% to about 10%.

18. The method of claim 17, wherein the metal oxide template layer is deposited on the aerospace component by the (ALD) process.

19. The method of claim 17, wherein the aerospace component is a turbine blade, a turbine vane, a support member, a frame, a rib, a fin, a pin fin, a combustor fuel nozzle, a combustor shield, an internal cooling channel, or any combination thereof.

20. The method of claim 17, wherein the aerospace component comprises a nickel superalloy comprising about 40 wt % or greater of nickel, about 0.5 wt % to about 15 wt % of aluminum, and one or more metals selected from chromium, cobalt, titanium, molybdenum, tungsten, or alloys thereof.

\* \* \* \* \*